(12) United States Patent
Fan et al.

(10) Patent No.: US 12,355,464 B2
(45) Date of Patent: Jul. 8, 2025

(54) SUCCESSIVE APPROXIMATION REGISTER (SAR) DIGITAL ANALOG-TO-DIGITAL CONVERTER (ADC), AND ELECTRONIC DEVICE

(71) Applicant: SHENZHEN CVA INNOVATION CO., LTD, Shenzhen (CN)

(72) Inventors: Shuo Fan, Shenzhen (CN); Songrong Bai, Shenzhen (CN); Jie Wang, Shenzhen (CN)

(73) Assignee: SHENZHEN CVA INNOVATION CO., LTD., Shenzhen (GN)

( * ) Notice: Subject to any disclaimer, the term of this patent is extended or adjusted under 35 U.S.C. 154(b) by 188 days.

(21) Appl. No.: 18/276,977

(22) PCT Filed: Apr. 23, 2021

(86) PCT No.: PCT/CN2021/089241
§ 371 (c)(1),
(2) Date: Aug. 11, 2023

(87) PCT Pub. No.: WO2022/174515
PCT Pub. Date: Aug. 25, 2022

(65) Prior Publication Data
US 2024/0120937 A1  Apr. 11, 2024

(30) Foreign Application Priority Data
Feb. 18, 2021  (CN) .......................... 202110190487.4

(51) Int. Cl.
H03M 1/46 (2006.01)
H03M 1/38 (2006.01)
(Continued)

(52) U.S. Cl.
CPC ............. *H03M 1/466* (2013.01); *H03M 1/38* (2013.01); *H03M 1/468* (2013.01); *H03M 1/68* (2013.01); *H03M 1/76* (2013.01); *H03M 1/804* (2013.01)

(58) Field of Classification Search
CPC .......... H03M 1/466; H03M 1/68; H03M 1/76; H03M 1/804; H03M 1/468; H03M 1/38
(Continued)

(56) References Cited

U.S. PATENT DOCUMENTS

| 7,928,871 | B2 | 4/2011 | Aruga et al. | |
|---|---|---|---|---|
| 9,461,665 | B1* | 10/2016 | Kim | ....................... H03M 1/462 |
| 10,097,198 | B1* | 10/2018 | Lee | ......................... H03M 1/68 |

FOREIGN PATENT DOCUMENTS

| CN | 104779954 A | 7/2015 |
|---|---|---|
| CN | 106374930 A | 2/2017 |

(Continued)

OTHER PUBLICATIONS

International Search Report and Written Opinion for International Applicaiton No. PCT/CN2021/089241 mailed Oct. 26, 2021.

*Primary Examiner* — Khai M Nguyen
(74) *Attorney, Agent, or Firm* — Dorsey & Whitney LLP

(57) ABSTRACT

A successive approximation register digital analog-to-digital converter, and an electronic device. The successive approximation register digital analog-to-digital converter comprises a positive capacitor array, a negative capacitor array, a switching circuit, a comparator and an SAR logic circuit, wherein the SAR logic circuit is configured to control the reference voltages to which the plurality of first capacitors are connected through the plurality of second capacitors are connected through the plurality of groups of second bottom plate switches according to each bit of digital signal outputted by the comparator.

14 Claims, 4 Drawing Sheets

(51) Int. Cl.
  *H03M 1/68* (2006.01)
  *H03M 1/76* (2006.01)
  *H03M 1/80* (2006.01)
(58) Field of Classification Search
  USPC .................................................. 341/161, 172
  See application file for complete search history.

(56) References Cited

FOREIGN PATENT DOCUMENTS

| CN | 108832928 A | 11/2018 |
| CN | 110649924 A | 1/2020 |
| CN | 111431529 A | 7/2020 |

* cited by examiner $V_{REFP}$
$V_{REFP5}$
$V_{REFP3}$
$V_{REFN5}$
$V_{REFP2}$
$V_{REFP6}$
$V_{REFN3}$
$V_{REFN6}$
$V_{CM}$
$V_{REFP7}$
$V_{REFP4}$
$V_{REFN7}$
$V_{REFN2}$
$V_{REFP8}$
$V_{REFN4}$
$V_{REFN8}$
$V_{REFN}$

FIG. 4

SUCCESSIVE APPROXIMATION REGISTER (SAR) DIGITAL ANALOG-TO-DIGITAL CONVERTER (ADC), AND ELECTRONIC DEVICE

CROSS REFERENCE TO RELATED APPLICATION

The present application is a US national stage disclosure of PCT international disclosure PCT/CN2021/089241, filed on Apr. 23, 2021, which claims priority to the Chinese Patent Application No. 202110190487.4, filed on Feb. 18, 2021 and titled "Successive Approximation Register Analog-to-Digital Converter (SAR ADC), and electronic device", the content of which is expressly incorporated herein by reference in its entirety.

TECHNICAL FIELD

The present disclosure relates to the field of circuits, and more particularly to a successive approximation register analog-to-digital converter (SAR ADC) and an electronic device.

BACKGROUND

An analog-to-digital converter (ADC) is a device that acquires and converts continuous analog signals into discrete digital signals for digital analysis and processing. The successive approximation register (SAR) ADC uses the dichotomous search method to continuously generate new analog voltages by means of the internally integrated digital-to-analog converter (DAC) to approximate the input analog signals. Finally, the digital inputs corresponding to the integrated DAC serve as outputs of the ADC.

The SAR ADC can be realized by a capacitive DAC. The capacitive DAC (CDAC) consists of an array of capacitors and corresponding bottom plate switches. The capacitance ratio between capacitors in the typical array of capacitors satisfies a binary weight. For the SAR ADC with n-bit design precision, the most significant bit capacitor 230 of the CDAC is $2^{(n-1)}C$. Therefore, the higher the output precision of the SAR ADC, the more the required capacitors. However, as the number of capacitors increases, the area of SAR ADC is larger and the cost is also higher. Accordingly, how to implement the SAR ADC with higher precision by using a smaller number of capacitors is an urgent problem to be solved.

SUMMARY

The present disclosure provides a successive approximation register analog-to-digital converter (SAR ADC) and an electronic device, which can implement the SAR ADC with a greater precision by using a smaller number of capacitors.

In the first aspect, the present disclosure provides a successive approximation register analog-to-digital converter (SAR ADC) (200), configured to output a n-bit digital signal ($D_{n-1}$, $D_{n-2}$, ..., $D_1$, $D_0$), and n being a positive integer greater than 1, the SAR ADC includes: a positive capacitor array (210) including (n–m) first capacitors ($D_{n-2}C_1$, ..., $D_mC_1$, $D_0C_1$) arranged in parallel, in which n>m, and in is a positive integer;

a negative capacitor array (220) including (n–m) second capacitors ($D_{n-2}C_2$, ..., $D_mC_2$, $D_0C_2$) arranged in parallel;

a switch circuit (230) including a plurality of groups of first bottom plate switches (2301) and a plurality of groups of second bottom plate switches (2302), each group of first bottom plate switches (2301) correspond to one first capacitor, each group of second bottom plate switches (2302) correspond to one second capacitor, each group of first bottom plate switches (2301) are configured to control a bottom plate of a corresponding first capacitor to be connected to a common-mode voltage ($V_{CM}$), a positive differential input signal ($V_{sigp}$), or one of a plurality of reference voltages, each group of second bottom plate switches (2302) are configured to control a bottom plate of a corresponding second capacitor to be connected to a common-mode voltage ($V_{CM}$), a negative differential input signal ($V_{sign}$), or one of a plurality of reference voltages, the plurality of reference voltages have offsets with different precisions with respect to the common-mode voltage ($V_{CM}$);

a comparator (240), a positive input terminal (2401) of the comparator being connected to a top plate of each first capacitor, a negative input terminal (2402) of the comparator being connected to a bottom plate of each second capacitor, and the comparator is configured to sequentially output each bit of digital signal in the n-bit digital signal according to voltages at the positive input terminal and the negative input terminal;

an SAR logic circuit (250), configured to control reference voltages to which the plurality of first capacitors are connected through the plurality of groups of first bottom plate switches (2301), and control reference voltages to which the plurality of second capacitors are connected through the plurality of groups of second bottom plate switches (2302) according to each bit of digital signal outputted by the comparator (240);

the SAR logic circuit (250) is configured to:

according to the most significant bit digital signal ($D_{n-2}$) in the n-bit digital signal, connect a bottom plate of each of the first capacitors ($D_{n-2}C_1$, ..., $D_mC_1$, $D_0C_1$) to a first initial reference voltage in the plurality of reference voltages, and connect a bottom plate of each of the second capacitors ($D_{n-2}C_2$, ..., $D_mC_2$, $D_0C_2$) to a second initial reference voltage in the plurality of reference voltages, in which the first initial reference voltage and the second initial reference voltage have opposite offset directions with respect to the common-mode voltage, the offset amounts of the first initial reference voltage and the second initial reference voltage with respect to the common-mode voltage are not the maximum offsets in offset amounts of the plurality of reference voltages with respect to the common-mode voltage, and are also not the minimum offsets;

control a target reference voltage connected to a bottom plate of the k-th bit first capacitor ($D_kC_1$) according to the k-th bit digital signal ($D_k$) and the most significant bit digital signal ($D_{n-1}$) in the n-bit digital signal, and control a target reference voltage connected to a bottom plate of the k-th bit second capacitor ($D_kC_2$) according to the k-th bit digital signal ($D_k$) and the most significant bit digital signal ($D_{n-1}$), wherein k=n–2, ..., m;

control a target reference voltage to which a bottom plate of the least significant bit first capacitor ($D_0C_1$) is connected according to the most significant bit digital signal ($D_{n-1}$) and each bit of digital signal of a low m-bit digital signal ($D_{m-1}$, ..., $D_0$) in the n-bit digital signal, and control a target reference voltage to which a bottom plate of the least significant bit second capacitor ($D_0C_2$) is connected according to the most significant bit digital signal ($D_{n-1}$) and each bit of digital signal of the low m-bit digital signal ($D_{m-1}, \ldots, D_0$) in the n-bit digital signal.

In the second aspect, an electronic device is provided, which includes the SAR ADC of any one of the above-mentioned embodiments in the first aspect.

Based on the above technical solution, by setting a plurality of reference voltages with different precisions on the bottom plate of the capacitor array, and further using the corresponding switch control strategy to adjust the reference voltage connected to the bottom plate of the capacitor in the capacitor array, so that the effect of an SAR ADC with more significant bits of outputs can be implemented by a capacitor array of the same size.

BRIEF DESCRIPTION OF THE DRAWINGS

FIG. 4 is a schematic diagram illustrating a relative position relationship of multiple reference signals according to an embodiment of the present disclosure.

DETAILED DESCRIPTION OF THE EMBODIMENTS

The technical solution in the embodiments of the present disclosure will be described with reference to the accompanying drawings of the embodiments of the present disclosure. Obviously, the described embodiments are some, but not all, embodiments of the present disclosure. With respect to the embodiments in the present disclosure, all other embodiments obtained by a person of ordinary skill in the art without involving any inventive effort should fall within the scope of the present disclosure.

The capacitive DAC (CDAC) consists of an array of capacitors and corresponding bottom plate switches. A capacitance ratio between capacitors in a typical array of capacitors satisfies a binary weight. If a unit capacitance value of the least significant bit capacitor is 1*C, the second-least significant bit capacitor has twice the unit capacitance value, i.e., 2*C, and so on; for the SAR ADC with the n-bit design precision, the capacitance value of the most significant bit capacitor of the CDAC is $2^{(n-1)}C$. The CDAC controls a conductive direction of the bottom plate switch of the capacitor corresponding to the weight according to the digital input, thereby generating an analog output corresponding to the digital input on a top plate of the array of capacitors, and implementing the n-bit design precision.

Figure 1:
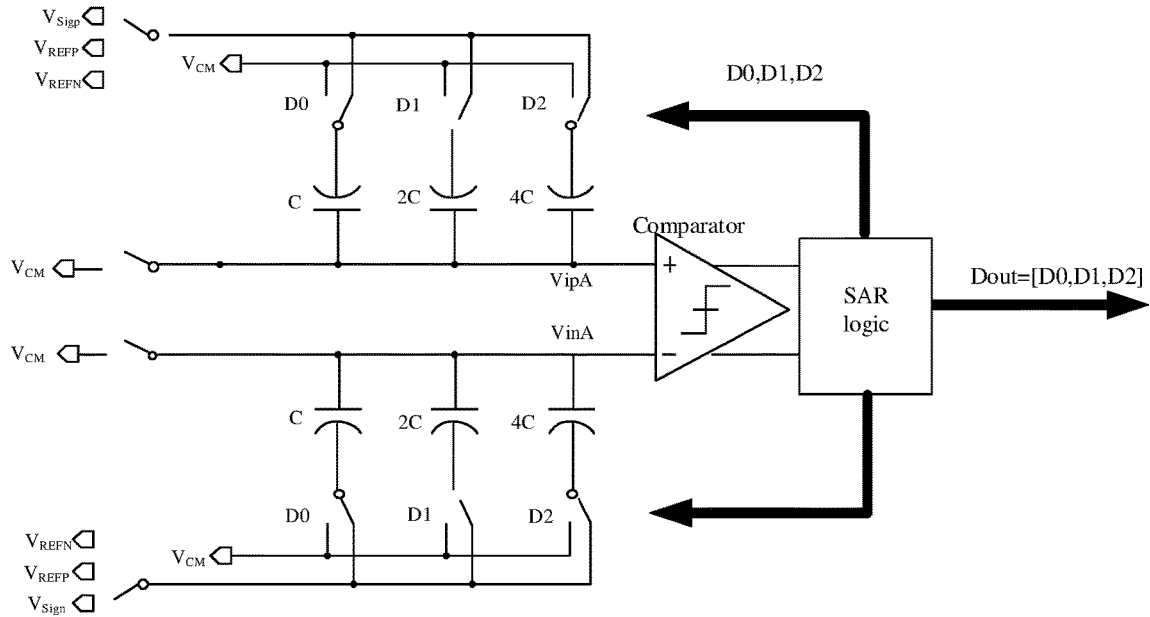
FIG. 1 is a schematic structure diagram of an SAR ADC in the related art.

FIG. 1 shows an exemplary structure of a 3-bit SAR ADC. The specific operation process of the SAR ADC is described with reference to FIG. 1.

It should be noted that in the circuit structure shown in FIG. 1, a common-mode voltage VCM, a first forward reference voltage VREFP, and a first reverse reference voltage VREFN satisfy the following relationship:

VCM=0.5(VREFP+VREFN);

VREFP=VCM+0.5VREF;

VREFN=VCM−0.5VREF.

In a first phase, i.e., a sampling phase, for a positive capacitor array, a lower plate (also referred to as a bottom plate, or a negative plate) of a capacitor is connected to a positive terminal of a differential input signal, i.e., Vsigp; and an upper plate (also referred to as a top plate, or a positive plate) of the capacitor is connected to the VCM.

At the moment, a total charge amount Qp in the positive capacitor array is represented as:

$Qp=(Vsigp-VCM) \times (C+C+2C+4C)=8(Vsigp-VCM) \times C$.

For the negative capacitor array, the upper plate of the capacitor is connected to a negative terminal of the differential input signal, i.e., Vsign, and the upper plate of the capacitor is connected to the VCM.

In this case, a total charge amount Qn in the negative capacitor array is represented as:

$Qn=(Vsign-VCM) \times (C+C+2C+4C)=8(Vsign-VCM) \times C$.

In a second phase, i.e., a conversion phase, the following steps may be performed.

In a first step, upper plates of all capacitors in the positive and negative capacitor arrays are disconnected from the VCM, and lower plates of all capacitors in the positive and negative capacitor arrays are connected to the VCM.

At this time, based on the charge conservation theorem, it is possible to calculate the voltage VipA of the positive input terminal of the comparator:

$8(Vsigp-VCM) \times C=(VCM-VipA) \times (C+C+2C+4C)$,

VipA=2VCM−Vsigp.

Similarly, a voltage VinA of a negative input terminal of a comparator is represented as:

VinA=2VCM−Vsign.

A second step: the comparator compares the magnitude of VipA to that of VinA, and outputs a digital signal D2.

When VipA>VinA, an output of the comparator is D2=1, and vice versa, the output of the comparator is D2=0.

D2 is the most significant bit output of the SAR ADC.

A third step: a voltage value connected to a lower plate of the most significant bit (MSB) capacitor is adjusted according to the output of the comparator.

In the example of FIG. 1, the MSB capacitor is the capacitor 4C.

Case 1: the output of the comparator is D2=1.

In this case, the MSB capacitor in the positive capacitor array is disconnected from the VCM and is connected to the VREFN instead. At the same time, the MSB capacitor in the negative capacitor array is disconnected from the VCM and is connected to the VREFP instead.

At the moment, based on the charge conservation principle, charges are redistributed in the capacitors of the capacitor array, VipA and VinA may change, and the changed VipA can be calculated according to the following formula:

$8(Vsigp-VCM) \times C=4C \times (VREFN-VipA)+4C \times (VCM-VipA)$,

VipA=0.5VREFN+0.5VCM−(Vsigp−VCM), $$VipA=0.5(VCM-0.5VREF)+0.5\times VCM-(Vsigp-VCM),$$

$$VipA=2VCM-Vsigp-\tfrac{1}{4}VREF.$$

Similarly, the changed VinA is calculated as:

$$VinA=2VCM-Vsign+\tfrac{1}{4}VREF.$$

Case 2: the output of the comparator is D2=0.

In this case, the lower plate of the MSB capacitor in the positive capacitor array is disconnected from the VCM and is connected to the VREFP instead.

Meanwhile, the lower plate of the MSB capacitor in the negative capacitor array is disconnected from the VCM and is connected to the VREFN instead.

Further, in a similar manner as in the case 1, the changed VipA and VinA are calculated based on the charge conservation principle, as follows:

$$VipA=2VCM-Vsigp+\tfrac{1}{4}VREF,$$

$$VinA=2VCM-Vsign-\tfrac{1}{4}VREF.$$

A fourth step: the comparator is turned on, and the most significant bit digital signal D1 is output according to the voltages of the positive input terminal and the negative input terminal; and the reference voltage value connected to the lower plate of the second-most significant bit capacitor is further changed according to the D1. In this example, the second-most significant bit capacitor is capacitor 2C.

For an implementation of changing the reference voltage value connected to the lower plate of the second-most significant bit capacitor according to D1, reference may be made to the implementation of changing the reference voltage value connected to the lower plate of the most significant bit capacitor according to D2 in the third step, and details are not repeated herein.

The above process is repeated to change the reference voltage value to which the negative plate of the 1C capacitor is connected according to the outputted digital signal D0.

The conversion is completed, and the output signals D2, D1, D0 of the SAR ADC are obtained.

As can be seen from the above operation, in order to implement the output of more significant bits of SAR ADC, more capacitors need to be added, and accordingly, the area and cost of the SAR ADC are increased.

In view of this, according to an embodiment of the present disclosure, a SAR ADC is provided, in which a reference voltage connected to a lower plate of a capacitor in a capacitor array is further adjusted with a corresponding switching control strategy by increasing a plurality of reference voltages having different precisions, so that the effect of the SAR ADC with more significant bits can be implemented by a capacitor array of the same size.

Figure 2:
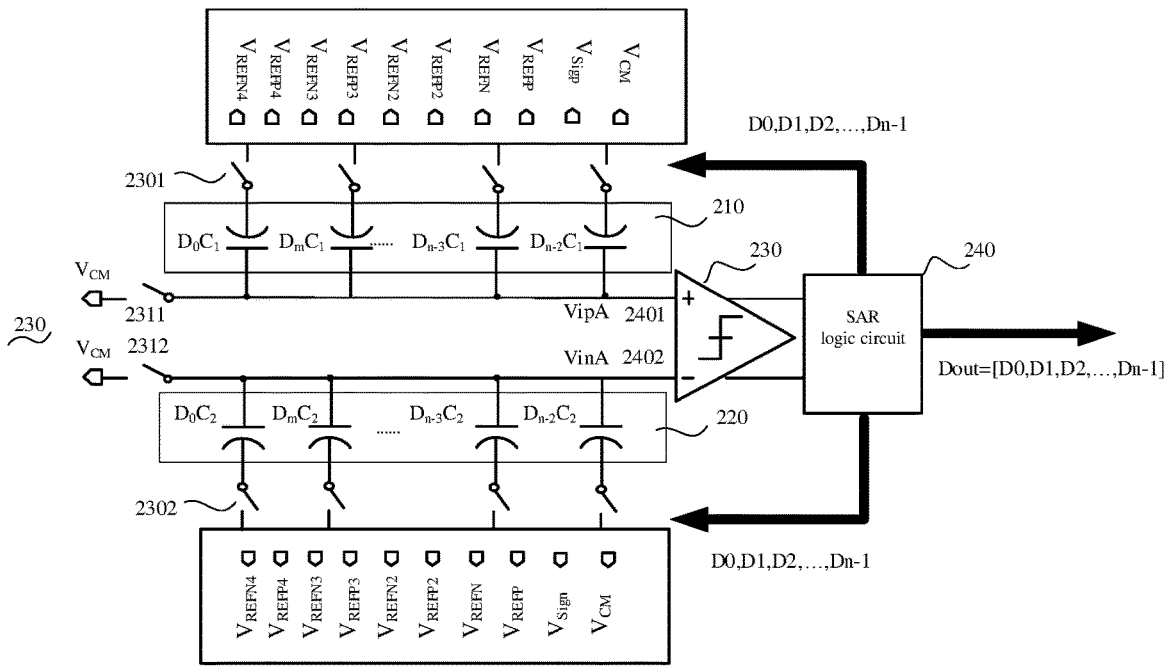
FIG. 2 is a schematic structure diagram of an SAR ADC according to an embodiment of the present disclosure.

FIG. 2 is a schematic block diagram of an SAR ADC according to an embodiment of the present disclosure.

In the present embodiment, the SAR ADC is configured to output a n-bit digital signal, i.e., $D_{n-1}$, $D_{n-2}$, ... D1 and D0, the number of bits of which is not specifically limited in the present disclosure, and may be, for example, 4, 6, 8, or the like.

As shown in FIG. 2, the SAR ADC 200 may include a positive capacitor array 210, a negative capacitor array 220, a switch circuit, a comparator 240, and an SAR logic circuit 250.

The positive capacitor array 210 may include (n−m) first capacitors ($D_{n-2}$ C1, ..., Dm C1, D0 C1) arranged in parallel; the negative capacitor array 220 may include (n−m) second capacitors ($D_{n-2}$ C2, ..., Dm C2, D0 C2) arranged in parallel, and m is a positive integer.

In some embodiments, in the positive capacitor array 210, a capacitance value of the least significant bit first capacitor (D0 C1) is equal to a capacitance value of the second-least significant bit first capacitor (Dm C1), and a capacitance value ratio from the second-least significant bit first capacitor (Dm C1) to the most significant bit first capacitor ($D_{n-2}$ C1) satisfies a binary weight.

In the negative capacitor array 220, the capacitance value of the least significant bit second capacitor (D0 C2) is equal to that of the second-least significant bit second capacitor (Dm C2), and the capacitance value ratio from the second-least significant bit second capacitor (Dm C2) to the most significant bit second capacitor ($D_{n-2}$ C2) satisfies the binary weight.

In the embodiment of the present disclosure, the most significant bit digital signal in the n-bit digital signal, i.e., $D_{n-1}$, can be configured to control the reference voltage connected to the lower plates of all capacitors in the positive capacitor array and the negative capacitor array; and the second-most significant bit digital signal can be configured to control the reference voltage connected to the most significant bit capacitors ($D_{n-2}$ C1 and $D_{n-2}$ C2), the least significant m-bit digital signal ($D_{m-1}$, ..., D0) can be configured to control the reference voltage to which the least significant bit capacitors (D0 C1 and D0 C2) are connected.

In an embodiment of the present disclosure, the switch circuit 230 may include a plurality of groups of first bottom plate switches 2301 and a plurality of groups of second bottom plate switches 2302. Each group of first bottom plate switches 2301 correspond to one first capacitor, and each group of second bottom plate switches 2302 correspond to one second capacitor. Each group of first bottom plate switches 2301 are configured to control a bottom plate of the corresponding first capacitor to be connected to a common-mode voltage VCM, a positive differential input signal Vsigp, or one of a plurality of reference voltages. Each group of second bottom plate switches 2302 are configured to control a bottom plate of the corresponding second capacitor to be connected to a common-mode voltage VCM, a negative differential input signal Vsign, or one of a plurality of reference voltages. The plurality of reference voltages have offsets with different precisions with respect to the common-mode voltage VCM.

It should be appreciated that the embodiments of the present disclosure do not limit the implementation modes of each group of first bottom plate switches 2301 and each group of second bottom plate switches 2302.

As an example, each group of first bottom plate switches 2301 may include a single-pole multi-throw switch configured to connect a corresponding first capacitor to different voltages under different conditions. Similarly, each group of second bottom plate switches 2302 may include a single-pole multi-throw switch configured to connect a corresponding second capacitor to different voltages under different conditions.

In alternative embodiments, each group of first bottom plate switches 2301 may also include a plurality of switches, such as a first switch and a second switch; the first switch may be a single-pole single-throw switch configured to control whether a corresponding first capacitor is connected to the common-mode voltage; and the second switch may is a single-pole multi-throw switch configured to control whether the corresponding first capacitor is connected to the positive differential input signal or a reference voltage.

Similarly, the same is true for each group of first bottom plate switches 2301, and the details are not repeated herein.

In an embodiment of the present disclosure, the plurality of reference voltages have offsets with different precisions and different offset directions with respect to the common-mode voltage VCM, and the offset direction refer to a forward offset direction and a reverse offset direction.

In the embodiment of the present disclosure, the positive input terminal 2401 of the comparator 240 is connected to a top plate of each first capacitor, the negative input terminal 2402 of the comparator 240 is connected to a bottom plate of each second capacitor; and the comparator 240 is configured to sequentially output each bit of digital signal in the n-bit digital signal according to the voltages of the positive input terminal 2401 and the negative input terminal 2402.

In an embodiment of the present disclosure, the SAR logic circuit 250 is configured to control the reference voltage to which the plurality of first capacitors are connected through the plurality of groups of first bottom plate switches 2301, and control the reference voltage to which the plurality of second capacitors are connected through the plurality of groups of second bottom plate switches 2302 according to each bit of digital signal outputted by the comparator 240.

Alternatively, in some embodiments, the plurality of reference voltages may include a first forward reference voltage VREFP, a first reverse reference voltage VREFN, a second forward reference voltage VREFP2, and a second reverse reference voltage VREFN2. The first forward reference voltage VREFP and the first reverse reference voltage VREFN each have a first offset with respect to the common-mode voltage VCM, and the two first offsets are in opposite offset directions. The second forward reference voltage VREFP2 and the second reverse reference voltage VREFN2 each have a second offset with respect to the common-mode voltage VCM, and the two second offsets are in opposite offset directions. The first offset is greater than the second offset.

In some embodiments of the present disclosure, the plurality of reference voltages may further include m reference voltage groups, and reference voltages in the m reference voltage groups may be configured to be connected to the least significant bit capacitors (D0 C1 and D0 C2).

It should be appreciated that the embodiments of the present disclosure do not specifically limit the number of the reference voltage groups, and the number of the reference voltage groups may be determined according to the number of bits of the SAR ADC to be implemented. For example, if one bit is to be added based on the existing technique, one reference voltage group may be provided; or if more bits are to be added, more reference signal groups may be provided.

In some embodiments of the present disclosure, the m reference voltage groups may be configured to be connected to the least significant bit capacitors in the positive and negative capacitor arrays to implement a fine adjustment with different precisions. Specifically, a reference voltage pair in the (i+1)-th reference voltage group may be configured to further perform the fine adjustment after a voltage adjustment using a reference voltage in the i-th reference voltage group, i=1, . . . .

Assuming that the i-th reference voltage group includes a reference voltage 1, corresponding to a reference voltage 2P and a reference voltage 2N in the (i+1)-th reference voltage group. The reference voltage 2P has a positive offset 1 with respect to the reference voltage 1, and the reference voltage 2N has a negative offset 1 with respect to the reference voltage 1. When the voltage needs to be reduced based on the reference voltage 1, the reference voltage connected to the bottom plate of the least significant bit capacitor can be adjusted to the reference voltage 2N; and when the voltage needs to be increased, the reference voltage connected to the bottom plate of the least significant bit capacitor can be adjusted to the reference voltage 2P.

In some embodiments of the present disclosure, m is equal to 1, and the one reference voltage group may include a third forward reference voltage VREFP3, a third reverse reference voltage VREFN3, a fourth forward reference voltage VREFP4, and a fourth reverse reference voltage VREFN4. The reference voltages satisfy the following relationship:

VREFP2=(VCM+VREFP)/2,

VREFN2=(VCM+VREFN)/2,

VREFP3=(VREFP2+VREFP)/2,

VREFN3=(VREFP2+VCM)/2,

VREFP4=(VCM+VREFN2)/2,

VREFN4=(VREFN2+VREFN)/2.

The third forward reference voltage VREFP3 has a positive third offset with respect to the second forward reference voltage VREFP2; the third reverse reference voltage VREFN3 has a negative third offset with respect to the second forward reference voltage VREFP2. The third forward reference voltage VREFP3 is configured to further perform an upward fine adjustment based on the second forward reference voltage VREFP2; the third reverse reference voltage VREFN3 is configured to further perform downward fine adjustment based on the second forward reference voltage VREFP2.

The fourth forward reference voltage VREFP4 has a positive third offset with respect to the second reverse reference voltage VREFN2, and the fourth reverse reference voltage VREFN4 has a negative third offset with respect to the second reverse reference voltage VREFN2. The fourth forward reference voltage VREFP4 is configured to further perform the upward fine adjustment based on the second reverse reference voltage VREFN2, and the fourth reverse reference voltage VREFN4 is configured to further perform the downward fine adjustment based on the second reverse reference voltage VREFN2.

In some embodiments of the present disclosure, the second offset may be one-half of the first offset, and the third offset may be one-half of the second offset. For example, the first offset is 0.5 VREF, the second offset is 0.25 VREF, and the third offset is 0.125 VREF.

In other embodiments of the present disclosure, m is greater than 1. Each reference voltage in the i-th reference voltage group of the m reference voltage groups corresponds to one reference voltage pair in the (i+1)-th reference voltage group, where i=1, 2, . . . .

Figure 3:
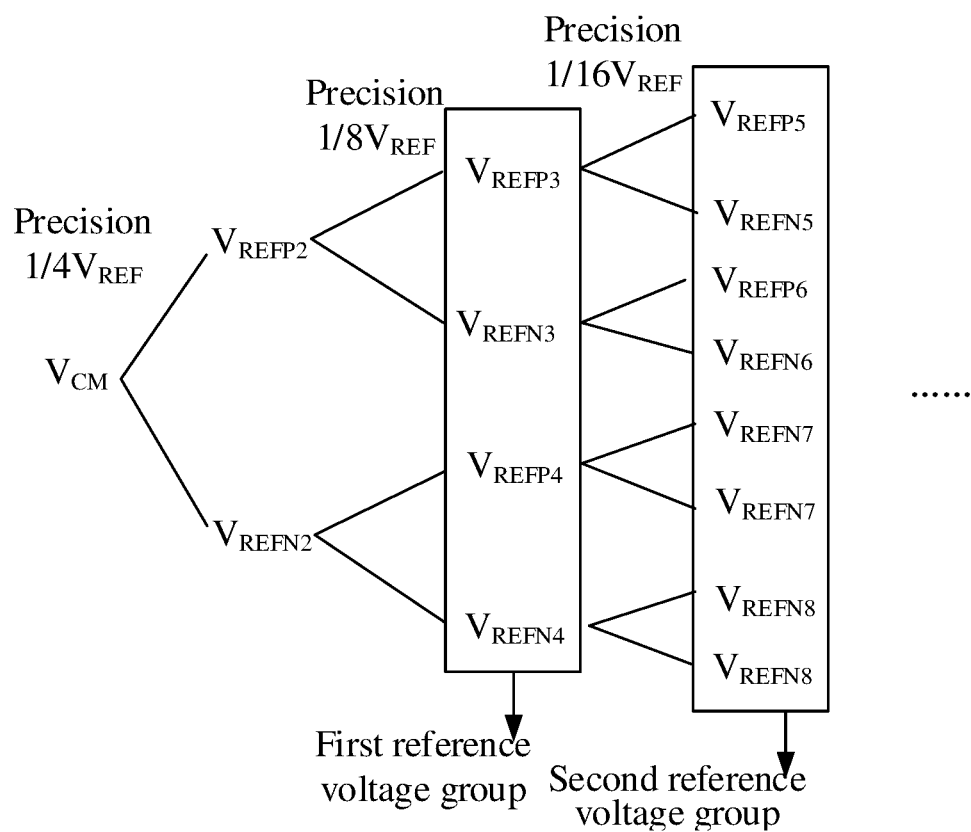
FIG. 3 is a schematic diagram illustrating multiple sets of reference signals according to an embodiment of the present disclosure.

As an example, as shown in FIGS. 3 and 4, the first reference voltage group of the m reference voltage groups may include the third forward reference voltage VREFP3, the third reverse reference voltage VREFN3, the fourth forward reference voltage VREFP4, and the fourth reverse reference voltage VREFN4.

The second reference voltage group may include a fifth forward reference voltage VREFP5, a fifth reverse reference voltage VREFP5, a sixth forward reference voltage VREFP6, a sixth reverse reference voltage VREFN6, a seventh forward reference voltage VREFP7, a seventh reverse reference voltage VREFN7, an eighth forward reference voltage VREFP8, and an eighth reverse reference voltage VREFN8. The reference voltages in the second reference voltage group and the foregoing reference voltages may satisfy the following relationship:

VREFP5=(VREFP3+VREFP)/2, VREFN5= (VREFP2+VREFP3)/2,

VREFP6=(VREFP2+VREFN3)/2, VREFN6=(VCM+ VREFN3)/2,

VREFP7=(VREFP3+VREFP)/2, VREFN7= (VREFP4+VREFP2)/2,

VREFP8=(VREFN4+VREFN2)/2, VREFN8= (VREFN+VREFN4)/2.

The fifth forward reference voltage VREFP5 has a positive fourth offset with respect to the third forward reference voltage VREFP3, and the fifth reverse reference voltage VREFN5 has a negative fourth offset with respect to the third forward reference voltage VREFP3. The fifth forward reference voltage VREFP5 is configured to further perform the upward fine adjustment based on the third forward reference voltage VREFP3, and the fifth reverse reference voltage VREFN5 is configured to further perform the downward fine adjustment based on the third forward reference voltage VREFP3.

The sixth forward reference voltage VREFP6 has a positive fourth offset with respect to the third reverse reference voltage VREFN3, and the sixth reverse reference voltage VREFN6 has a negative fourth offset with respect to the third reverse reference voltage VREFN3. The sixth forward reference voltage VREFP6 is configured to further perform the upward fine adjustment based on the third reverse reference voltage VREFN3, and the sixth reverse reference voltage VREFN6 is configured to further perform the downward fine adjustment based on the third reverse reference voltage VREFN3.

The seventh forward reference voltage VREFP7 has a positive fourth offset with respect to the fourth forward reference voltage VREFP4, and the seventh reverse reference voltage VREFN7 has a negative fourth offset with respect to the fourth forward reference voltage VREFP4. The seventh forward reference voltage VREFP7 is configured to further perform the upward fine adjustment based on the fourth forward reference voltage VREFP4, and the seventh reverse reference voltage VREFN7 is configured to further perform the downward fine adjustment based on the fourth forward reference voltage VREFP4.

The eighth forward reference voltage VREFP7 has a positive fourth offset with respect to the fourth reverse reference voltage VREFN4, and the eighth reverse reference voltage VREFN7 has a negative fourth offset with respect to the fourth reverse reference voltage VREFN4. The eighth forward reference voltage VREFP8 is configured to further perform the upward fine adjustment based on the fourth reverse reference voltage VREFN4, and the eighth reverse reference voltage VREFN8 is configured to further perform the downward fine adjustment based on the fourth reverse reference voltage VREFN4.

The fourth offset is one-half of the third offset. For example, the third offset is ⅛VREF, and the fourth offset is 1/16VREF.

Of course, more reference signal groups may be provided to implement the output of multi-bit digital signal. The reference signals in the reference signal group are provided in a similar manner, and details are not described herein.

Therefore, in the embodiment of the present disclosure, by providing reference voltage groups with different preci-sion, the least significant bit capacitor is further configured to be connected to the reference voltage groups with different precisions, thereby implementing the SAR ADC with different precisions. For example, if one-bit precision is to be added, the least significant bit capacitor may be connected to the reference voltages in the first reference voltage group; or two-bit precision is to be added, the least significant bit capacitor may be connected to the reference voltages in the second reference voltage group, and so on.

Hereinafter, a switch control logic of the SAR logic circuit 250 will be described with reference to FIGS. 3 to 5.

It should be appreciated that the switch control logic of the SAR logic circuit 250 in the present embodiment has three cases: a control logic corresponding to the most significant bit digital signal Dn−1 (denoted as a control logic 1), a control logic corresponding to digital signals from the second-most significant bit digital signal to the m-th bit digital signal (denoted as a control logic 2), and a control logic corresponding to the low m-bit digital signal (denoted as a control logic 3).

Figure 5:
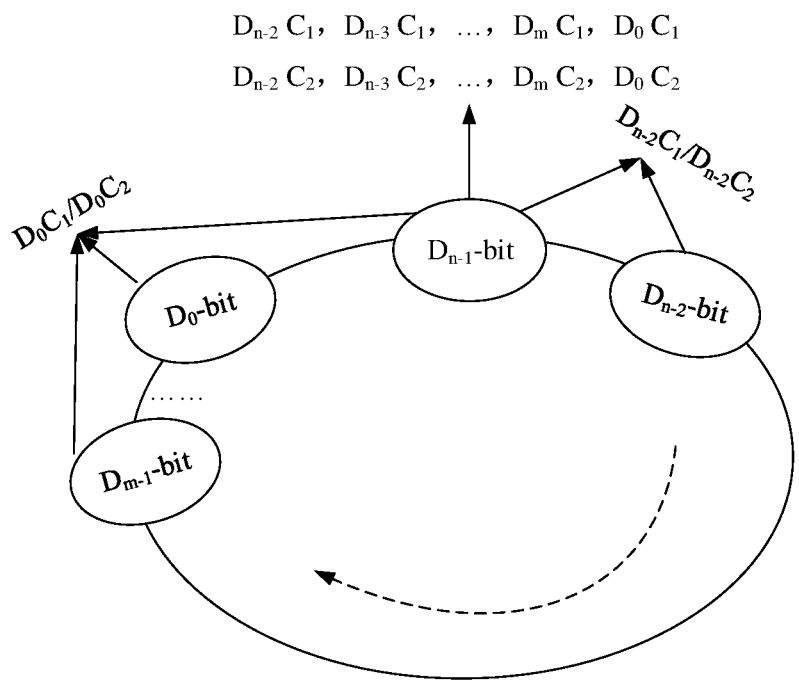
FIG. 5 is a control logic diagram of a capacitor array according to an embodiment of the present disclosure.

The control logic 1:

In some embodiments of the present disclosure, as shown in FIG. 5, the SAR logic circuit 250 is specifically configured to:

according to the most significant bit digital signal Dn−2 in the n-bit digital signal, control a group of first bottom plate switches 2301 corresponding to each of the first capacitors, to connect the bottom plate of each of the first capacitors (Dn−2 C1, . . . , Dm C1, D0 C1) to a first initial reference voltage in the plurality of reference voltages, and control a group of second bottom plate switches 2302 corresponding to each of the second capacitors, to connect the bottom plate of each of the second capacitors (Dn−2 C2, . . . , Dm C2, D0 C2) to a second initial reference voltage in the plurality of reference voltages.

The first initial reference voltage and the second initial reference voltage have opposite offset directions with respect to the common-mode voltage VCM. The offset amounts of the first initial reference voltage and the second initial reference voltage with respect to the common-mode voltage VCM are not the maximum offsets in the offset amounts of the plurality of reference voltages with respect to the common-mode voltage, and are also not the minimum offsets.

Unlike the switch control strategy illustrated in FIG. 1, in the embodiment of the present disclosure, the SAR logic circuit 250 may pull the voltages of the bottom plates of the capacitors in each capacitor array to the same voltage level according to the most significant bit digital signal Dn−1. The voltage level has an appropriate offset amount with respect to the common-mode voltage VCM. Further fine adjustment of the voltage may be performed on this voltage level, so that a convergence rate of the SAR ADC can be improved; and compared to the existing technique, the output result with a finer precision can be implemented through the adjustment process of the same number of steps.

Alternatively, in some embodiments, the first initial reference voltage is the second forward reference voltage VREFP2, and the second initial reference voltage is the second reverse reference voltage VREFN2.

Alternatively, the first initial reference voltage is the second reverse reference voltage VREFN2, and the second initial reference voltage is the second forward reference voltage VREFP2.

In other alternative embodiments, the first initial reference voltage and the second initial reference voltage may also be other reference voltage values. When other reference voltages are connected to, only the subsequent switch logic needs to be adaptively adjusted.

The first initial reference voltage and the second initial reference voltage are each one of the second forward reference voltage and the second reverse reference voltage, respectively, as an example for illustration. However, the present disclosure is not limited thereto.

In some embodiments, the SAR logic circuit 250 is specifically configured to:
  when the most significant bit digital signal Dn−1 is 1, control the bottom plate of each of the first capacitors to be connected to the second reverse reference voltage VREFN2, and control the bottom plate of each of the second capacitors to be connected to the second forward reference voltage VREFP2; or
  when the most significant bit digital signal Dn−1 is 0, control the bottom plate of each of the first capacitors to be connected to the second forward reference voltage VREFP2, and control the bottom plate of each of the second capacitors to be connected to the second reverse reference voltage VREFN2.

When the most significant bit digital signal Dn−1 is 1, it indicates that VipA>VinA, and the VipA needs to be decreased, so that the bottom plate of each of the first capacitors may be connected to the second reverse reference voltage VREFN2 lower than VCM. When the most significant bit digital signal Dn−1 is 0, it indicates that VipA<VinA, and the VipA needs to be increased, so that the bottom plate of each of the first capacitors may be connected to the second forward reference voltage VREFP2 higher than VCM.

Control logic 2:

In other embodiments of the present disclosure, as shown in FIG. 5, the SAR logic circuit 250 is further configured to:
  control a target reference voltage connected to the bottom plate of the k-th bit first capacitor Dk C1 according to the k-th bit digital signal Dk and the most significant bit digital signal Dn−1 in the n-bit digital signal, and control the target reference voltage connected to the bottom plate of the k-th bit second capacitor Dk C2 according to the k-th bit digital signal Dk and the most significant bit digital signal Dn−1, where k=n−2, . . . , m.

Unlike the switch control strategy in the example of FIG. 1, in the embodiment of the present disclosure, the adjustment of the voltage on each capacitor is performed with reference to the reference voltage to which the capacitor is currently connected after the previous voltage adjustment, i.e., the adjustment is performed using the reference voltage to which the capacitor is connected after the previous voltage adjustment as the reference, rather than directly controlling the voltage to which the Dk bit capacitor is connected according to the output result Dk of the comparator, thereby facilitating the finer adjustment of the voltage, and implement the SAR ADC with the finer precision.

In some embodiments, the SAR logic circuit 250 is configured to:
  when the most significant bit digital signal Dn−1 is 1 and the k-th bit digital signal Dk is 1, control the bottom plate of the k-th bit first capacitor Dk C1 to be connected to the first reverse reference voltage VREFN, and control the bottom plate of the k-th bit second capacitor Dk C2 to be connected to the first forward reference voltage VREFP; or
  when the most significant bit digital signal Dn−1 is 0 and the k-th bit digital signal Dk is 1, control the bottom plate of the k-th bit first capacitor Dk C1 to be connected to the second reverse reference voltage VREFN2, and control the bottom plate of the k-th bit second capacitor Dk C2 to be connected to the second forward reference voltage VREFP2; or
  when the most significant bit digital signal $D_{n-1}$ is 1 and the k-th bit digital signal $D_k$ is 0, control the bottom plate of the k-th bit first capacitor (DkC1) to be connected to the second forward reference voltage VREFP2, and control the bottom plate of the k-th bit second capacitor (DkC2) to be connected to the second reverse reference voltage VREFN2; or
  when the most significant bit digital signal Dn−1 is 0 and the k-th bit digital signal Dk is 0, control the bottom plate of the k-th bit first capacitor Dk C1 to be connected to the first forward reference voltage VREFP, and control the bottom plate of the k-th bit second capacitor Dk C2 to be connected to the first reverse reference voltage VREFN.

Control Logic 3:

In some embodiments of the present disclosure, as shown in FIG. 5, the SAR logic circuit 250 is further configured to:
  control a target reference voltage to which the bottom plate of the least significant bit first capacitor D0 C1 is connected according to the most significant bit digital signal Dn−1 and each bit of digital signal of the low m-bit digital signal Dm−1, . . . , D0 in the n-bit digital signal, and control the target reference voltage to which the bottom plate of the least significant bit second capacitor D0 C2 is connected according to the most significant bit digital signal Dn−1 and each bit of digital signal of the low m-bit digital signal Dm−1, . . . , D0 in the n-bit digital signal.

Specifically, when the comparator outputs the j-th bit digital signal of the low m-bit digital signal, the SAR logic circuit 250 is configured to determine the reference voltage to which the bottom plate of the least significant bit first capacitor (D0 C1) is currently connected according to the most significant bit digital signal Dn−1 and a digital signal before the j-th bit digital signal Dj in the low m-bit digital signals Dm−1, . . . , D0, adjust the reference voltage to which the least significant bit first capacitor D0C1 is connected according to the j-th bit digital signal Dj and the reference voltage to which the least significant bit first capacitor D0C1 is currently connected, determine the reference voltage to which the bottom plate of the least significant bit second capacitor D0 C2 is currently connected according to the most significant bit digital signal Dn−1 and the digital signal before the j-th bit digital signal Dj in the low m-bit digital signal Dm−1, . . . , D0, and adjust the reference voltage to which the least significant bit second capacitor D0 C2 is connected according to the j-th bit digital signal Dj and the reference voltage to which the least significant bit second capacitor D0 C2 is currently connected, where j=m−1, . . . , 0.

It should be appreciated that if the j-th bit digital signal is the most significant bit of the low m-bit digital signal, in this case, the reference voltage to which the bottom plate of the least significant bit first capacitor D0 C1 is currently connected may be determined only according to the most significant bit digital signal Dn−1.

For example, when the comparator 250 outputs the (m−1)-th bit digital signal, the SAR logic circuit 250 may determine the reference voltage to which the least significant bit first capacitor D0 C1 is currently connected according to the value of the most significant bit digital signal Dn−1, and further, may determine to perform an upward adjustment or a downward adjustment based on the currently connected reference voltage in combination with the value of the (m−1)-th bit digital signal Dm−1.

It is assumed that it is determined according to the most significant bit digital signal Dn−1 that the least significant bit first capacitor D0 C1 is connected to the reference voltage p in the first reference voltage group, and the reference voltage p corresponds to a reference voltage q+ and a reference voltage q− in the next reference voltage group in order to perform the upward fine adjustment and the downward fine adjustment based on the reference voltage p, respectively.

If the (m−1)-th bit digital signal Dm−1 is 1, it indicates that VipA>VinA and the VipA needs to be decreased, the bottom plate of the least significant bit first capacitor D0 C1 may be connected to the reference voltage q−. Alternatively, if the (m−1)-th bit digital signal Dm−1 is 0, it indicates that VipA<VinA and the VipA needs to be increased, the bottom plate of the least significant bit first capacitor D0 C1 may be connected to the reference voltage q+.

If m is greater than 1, the comparator 240 may also output the (m−2)-th bit digital signal Dm−2 according to a current connection relationship. Further, the SAR logic circuit 250 may determine the reference voltage to which the least significant bit first capacitor DOC1 is currently connected according to values of the most significant bit digital signal Dn−1 and the (m−1)-th bit digital signal Dm−1; and then it may be determined whether to perform the upward adjustment or the downward adjustment based on the reference voltage to which the least significant bit first capacitor DOC1 is currently connected in combination with the value of the (m−2)-th bit digital signal Dm−2. The specific adjustment modes are similar, and the details will not be repeated herein.

Taking m=1 as an example, the specific implementation of the control logic 3 of the SAR logic circuit 250 is described below.

Case 1: the least significant bit digital signal D0 is 1, and the most significant bit digital signal Dn−1 is 0.

The most significant bit digital signal Dn−1 is 0, which indicates that the least significant bit first capacitor D0 C1 is currently connected to the second forward reference voltage VREFP2. The least significant bit digital signal is 1, it indicates that VipA needs to be decreased, i.e., the downward fine adjustment is required based on the second forward reference voltage VREFP2, then the bottom plate of the least significant bit first capacitor DOC1 is connected to the third reverse reference voltage VREFN3. Similarly, the bottom plate of the least significant bit second capacitor DOC2 may be connected to the fourth forward reference voltage VREFP4.

Case 2: the least significant bit digital signal D0 is 0, and the most significant bit digital signal Dn−1 is 0.

The most significant bit digital signal Dn−1 is 0, which indicates that the least significant bit first capacitor D0 C1 is currently connected to the second forward reference voltage VREFP2. The least significant bit digital signal is 0, it indicates that the VipA needs to be increased, i.e., that the upward fine adjustment is required based on the second forward reference voltage VREFP2, then the bottom plate of the least significant bit first capacitor D0 C1 is connected to the VREFP3. Similarly, the bottom plate of the least significant bit second capacitor D0 C2 may be connected to the fourth reverse reference voltage VREFN4.

Case 3: the least significant bit digital signal D0 is 1, and the most significant bit digital signal Dn−1 is 1.

The most significant bit digital signal Dn−1 is 1, which indicates that the least significant bit first capacitor D0 C1 is currently connected to the second forward reference voltage VREFN2. The least significant bit digital signal is 1, it indicates that VipA needs to be decreased, that is, the downward fine adjustment is required based on the second reverse reference voltage VREFN2, then the bottom plate of the least significant bit first capacitor D0 C1 is connected to the fourth reverse reference voltage VREFN4. Similarly, the bottom plate of the least significant bit second capacitor D0 C2 may be connected to the third forward reference voltage VREFP3.

Case 4: the least significant bit digital signal D0 is 0, and the most significant bit digital signal Dn−1 is 1.

The most significant bit digital signal Dn−1 is 1, it indicates that the least significant bit first capacitor D0 C1 is currently connected to the second forward reference voltage VREFN2. The least significant bit digital signal is 0, it indicates that VipA needs to be increased, that is, the upward fine adjustment is required based on the second reverse reference voltage VREFN2, then the bottom plate of the least significant bit first capacitor D0 C1 can be connected to the fourth forward reference voltage VREFP4. Similarly, the bottom plate of the least significant bit second capacitor D0 C2 may be connected to the third reverse reference voltage VREFN3.

Therefore, in the embodiment of the present disclosure, by configuring a plurality of reference voltages with different precisions and different offset directions, the reference voltages connected to the negative plates of the capacitors in the positive and negative capacitor arrays are further controlled by the SAR logic circuit, so that the SAR ADC with a finer precision can be implemented by configuring a reference voltage with the finer precision without increasing the number of the capacitors, and meanwhile the power consumption of the entire capacitor array is reduced because the number of the capacitors is not increased.

In an embodiment of the present disclosure, as shown in FIG. 2, the switch circuit may further include a first positive terminal sampling switch 2311 and a second positive terminal sampling switch 2312. A top plate of each first capacitor in the positive capacitor array 210 is connected to the common-mode voltage VCM through the first positive terminal sampling switch 2311, and a top plate of each second capacitor in the negative capacitor array 220 is connected to the common-mode voltage VCM through the second positive terminal sampling switch 2312.

Alternatively, in some embodiments, the SAR ADC 200 may be implemented in a single-ended mode, i.e., may include only one capacitor array. The operation principle is similar, the details will not be repeated herein.

A specific implementation process is described by using a 4-bit SAR ADC as an example as follows, but the present disclosure is not limited thereto.

In this example, m=1, m reference voltage groups may include a first reference voltage group in FIG. 3. In order to implement the 4-bit SAR ADC, the positive capacitor array and the negative capacitor array may respectively include three capacitors; and the capacitance values of the capacitors may be C, C, and 2C in sequence, where 2C denotes the capacitance value of the most significant bit capacitor, and C denotes the capacitance values of the least significant bit capacitor and the second-least significant bit capacitor.

1. First Phase, i.e., a Sampling Phase.

In this stage, the first positive terminal sampling switch 2311 is connected to the common-mode voltage VCM, i.e., the upper plate of the first capacitor in the positive capacitor array 210 is connected to VCM, the bottom plate of each first capacitor in the positive capacitor array is connected to the positive differential input signal Vsigp; the second positive terminal sampling switch 2312 is connected to the common-mode voltage VCM, i.e., the upper plate of the second capacitor in the negative capacitor array 220 is connected to VCM, and the bottom plate of each second capacitor in the negative capacitor array 220 is connected to the negative differential input signal Vsign.

At this moment, the total charge amount Qp in the positive capacitor array 210 is $$Qp=(\text{Vsigp}-\text{VCM})\times(C+C+2C)=4(\text{Vsigp}-\text{VCM})\times C.$$

At this moment, the total charge amount Qn in the negative capacitor array 220 is:

$$Qn=(\text{Vsign}-\text{VCM})\times(C+C+2C)=4(\text{Vsign}-\text{VCM})\times C.$$

In the second phase, i.e., a conversion phase, or referred to as a conversion period, the following steps may be performed.

At the first step, the first positive terminal sampling switch 2311 is disconnected from the common-mode voltage VCM, i.e., the top plates of all the first capacitors are disconnected from the common-mode voltage VCM, the bottom plate of each first capacitor in the positive capacitor array 210 is connected to the common-mode voltage VCM, and the second positive terminal sampling switch 2312 is disconnected from the common-mode voltage VCM, that is, the top plates of all the second capacitors are disconnected from the common-mode voltage VCM, the bottom plate of each second capacitor in the negative capacitor array 220 is connected to the common-mode voltage VCM.

In this case, according to the charge conservation theorem, the voltage VipA at the positive input terminal of the comparator 240 can be calculated as follows:

$$4(\text{Vsigp}-\text{VCM})\times C=(\text{VCM}-\text{VipA})\times(C+C+2C),$$

$$\text{VipA}=2\text{VCM}-\text{Vsigp}.$$

Similarly, the voltage VinA of the negative input terminal of the comparator 240 can be calculated as follows:

$$\text{VinA}=2\text{VCM}-\text{Vsign}.$$

At the second step, the comparator 240 outputs the most significant bit digital signal D3 according to the voltage VipA at the positive input terminal and the voltage VinA at the negative input terminal.

If VipA>VinA, the comparator 240 outputs D3=1, and vice versa, the comparator 240 outputs D3=0.

At the third step, the reference voltages connected to the bottom plates of all the first capacitors in the positive capacitor array 210 and all the second capacitors in the negative capacitor array 220 are adjusted according to the outputs of the comparator 240, rather than merely adjusting the reference voltage connected to the bottom plate of the most significant bit capacitor.

Case 1: D3=1

In this case, the bottom plates of all the first capacitors in the positive capacitor array 210 are connected to VREFN2 (corresponding to the first initial reference voltage), and the bottom plates of all the second capacitors in the negative capacitor array 220 are connected to VREFP2 (corresponding to the second initial reference voltage).

At this moment, based on the charge conservation law, the voltage VipA at the positive input terminal of the comparator 240 is calculated as follows:

$$4(\text{Vsigp}-\text{VCM})\times C=4(\text{VCM}-0.25\text{VREF}-\text{VipA})\times C,$$

$$\text{VipA}=2\text{VCM}-\text{Vsigp}-\tfrac{1}{4}\text{VREF}.$$

Based on the charge conservation law, the voltage VinA at the negative input terminal of the comparator 240 is calculated as follows:

$$4(\text{Vsign}-\text{VCM})\times C=4(\text{VCM}+0.25\text{VREF}-\text{VinA})\times C,$$

$$\text{VinA}=2\text{VCM}-\text{Vsign}+\tfrac{1}{4}\text{VREF}.$$

Case 2: D3=0

In this case, the bottom plates of all the first capacitors in the positive capacitor array 210 are connected to VREFP2 (corresponding to the first initial reference voltage), and the bottom plates of all the second capacitors in the negative capacitor array 220 are connected to VREFN2 (corresponding to the second initial reference voltage).

At this moment, based on the charge conservation law, the voltage VipA at the positive input terminal and the voltage VinA at the negative input terminal of the comparator 240 are respectively calculated as follows:

$$4(\text{Vsigp}-\text{VCM})\times C=4(\text{VCM}+0.25\text{VREF}-\text{VipA})\times C,$$

$$\text{VipA}=2\text{VCM}-\text{Vsigp}+\tfrac{1}{4}\text{VREF},$$

$$4(\text{Vsign}-\text{VCM})\times C=4(\text{VCM}-0.25\text{VREF}-\text{VinA})\times C,$$

$$\text{VinA}=2\text{VCM}-\text{Vsign}-\tfrac{1}{4}\text{VREF}.$$

At the fourth step, the comparator 240 outputs the second-most significant bit digital signal D2 according to the voltage VipA at the positive input terminal and the voltage VinA at the negative input terminal based on the connection relationship in the third step.

Further, the SAR logic circuit 250 adjusts the reference voltage connected to the most significant bit capacitor (i.e., the capacitor 2C) according to the most significant bit digital signal D3 and the second-most significant bit digital signal D2.

Case 1: D3=1.

This case shows that at this moment, the bottom plates of all the first capacitors in the positive capacitor array 210 are connected to VREFN2, and the bottom plates of all the second capacitors in the negative capacitor array 220 are connected to VREFP2.

Case 1.1: D2=1.

This case indicates that the VipA needs to be decreased to approach the VinA, so that the bottom plate of the most significant bit first capacitor (i.e., the first capacitor 2C) in the positive capacitor array 210 is connected to the VREFN, and the bottom plate of the most significant bit second capacitor (i.e., the second capacitor 2C) in the negative capacitor array 220 is connected to the VREFP.

At this moment, based on the charge conservation law, the voltage VipA at the positive input terminal of the comparator 240 is calculated as follows:

$$4(\text{Vsigp}-\text{VCM})\times C=2(\text{VCM}-0.25\text{VREF}-\text{VipA})\times C+2(\text{VCM}-0.5\text{VREF}-\text{VipA})\times C,$$

and it can be obtained by simplification that $\text{VipA}=2\text{VCM}-\text{Vsigp}-\tfrac{1}{4}\text{VREF}-\tfrac{1}{8}\text{VREF}$.

Based on the charge conservation law, the voltage VinA at the negative input terminal of the comparator 240 can be calculated as follows:

$$4(\text{Vsigp}-\text{VCM})\times C=2(\text{VCM}+0.25\text{VREF}-\text{VipA})\times C+2(\text{VCM}+0.5\text{VREF}-\text{VipA})\times C,$$

and it can be obtained by simplification that $\text{VinA}=2\text{VCM}-\text{Vsigp}+\tfrac{1}{4}\text{VREF}+\tfrac{1}{8}\text{VREF}$.

Case 1.2: D2=0.

This case indicates that the VipA needs to be increased to approach the VinA, so that the bottom plate of the most significant bit first capacitor (i.e., the first capacitor 2C) in the positive capacitor array 210 is connected to the VREFP2, and the bottom plate of the most significant bit second capacitor (i.e., the second capacitor 2C) in the negative capacitor array 220 is connected to the VREFN2.

At this moment, based on the charge conservation law, the voltage VipA at the positive input terminal and the voltage VinA at the negative input terminal of the comparator 240 are calculated as follows:

$$VipA=2VCM-Vsigp-\tfrac{1}{4}VREF+\tfrac{1}{8}VREF,$$

$$VinA=2VCM-Vsigp+\tfrac{1}{4}VREF-\tfrac{1}{8}VREF.$$

Case 2: D3=0.

This case indicates that at this moment, the bottom plates of all the first capacitors in the positive capacitor array 210 are connected to VREFP2, and the bottom plates of all the second capacitors in the negative capacitor array 220 are connected to VREFN2.

Case 2.1: D2=1.

This case indicates that the value of VipA needs to be decreased to approach VinA, so that the bottom plate of the most significant bit first capacitor (i.e., the first capacitor 2C) in the positive capacitor array 210 needs to be connected to the VREFN2, and the bottom plate of the most significant bit second capacitor (i.e., the second capacitor 2C) in the negative capacitor array needs to be connected to the VREFP2.

At this moment, based on the charge conservation law, the voltage VipA at the positive input terminal and the voltage VinA at the negative input terminal of the comparator are respectively calculated as follows:

$$VipA=2VCM-Vsigp+\tfrac{1}{4}VREF-\tfrac{1}{8}VREF,$$

$$VinA=2VCM-Vsigp-\tfrac{1}{4}VREF+\tfrac{1}{8}VREF.$$

Case 2.2: D2=0.

This case indicates that the value of VipA needs to be increased to approach the VinA, so that the bottom plate of the most significant bit first capacitor (i.e., 2C) in the positive capacitor array 210 needs to be connected to the VREFP, and the bottom plate of the most significant bit second capacitor in the negative capacitor array 220 needs to be connected to the VREFN.

At this moment, based on the charge conservation law, the voltage VipA at the positive input terminal and the voltage VinA at the negative input terminal of the comparator 240 are calculated as follows:

$$VipA=2VCM-Vsigp+\tfrac{1}{4}VREF-\tfrac{1}{8}VREF,$$

$$VinA=2VCM-Vsigp-\tfrac{1}{4}VREF-\tfrac{1}{8}VREF.$$

At the fifth step, the comparator 240 outputs the digital signal D1 according to the voltage VipA at the positive input terminal and the voltage VinA at the negative input terminal based on the connection relationship in the fourth step.

Further, the SAR logic circuit 250 adjusts the reference voltage connected to the second-most significant bit capacitor (i.e., capacitor 1C) according to the most significant bit digital signal D3 and the digital signal D1.

For a specific adjustment mode, reference is made to the implementation process of adjusting the reference voltage connected to the most significant bit capacitor according to the digital signal D3 and the digital signal D2 in the fourth step. For brevity, details are not repeated herein.

Further, the comparator 240 outputs the digital signal D0 according to the voltage VipA at the positive input terminal and the voltage VinA at the negative input terminal based on the connection relationship in the fifth step.

At the sixth step, the SAR logic circuit 250 adjusts the reference voltage connected to the least significant bit capacitor according to the most significant bit digital signal D3 and the least significant bit digital signal D0.

Case 1: D0=1, and D3=0.

If the bottom plate of the least significant bit first capacitor in the positive capacitor array 210 is connected to the VREFP2 at this moment, the bottom plate of the least significant bit first capacitor in the positive capacitor array 210 is adjusted to be connected to the VREFN3; if the bottom plate of the least significant bit first capacitor in the negative capacitor array 220 is connected to the VREFN2 at this moment, the bottom plate of the least significant bit first capacitor in the negative capacitor array 220 is adjusted to be connected to the VREFP4.

Case 2: D0=0, and D3=0.

If the bottom plate of the least significant bit first capacitor in the positive capacitor array 210 is connected to the VREFP2 at this moment, the bottom plate of the least significant bit first capacitor in the positive capacitor array 210 is adjusted to be connected to the VREFP3; if the bottom plate of the least significant bit first capacitor in the negative capacitor array 220 is connected to the VREFN2 at this moment, the bottom plate of the least significant bit first capacitor in the negative capacitor array 220 is adjusted to be connected to the VREFN4.

Case 3: D0=1, and D3=1.

If the bottom plate of the least significant bit first capacitor in the positive capacitor array 210 is connected to the VREFN2 at this moment, the bottom plate of the least significant bit first capacitor in the positive capacitor array 210 is adjusted to be connected to the VREFN4; if the bottom plate of the least significant bit first capacitor in the negative capacitor array 220 is connected to the VREFP2 at this moment, the bottom plate of the least significant bit first capacitor in the negative capacitor array 220 is adjusted to be connected to the VREFP3.

Case 4: D0=0, and D3=1.

If the bottom plate of the least significant bit first capacitor in the positive capacitor array 210 is connected to the VREFN2 at this moment, the bottom plate of the least significant bit first capacitor in the positive capacitor array 210 is adjusted to be connected to the VREFP4; if the bottom plate of the least significant bit first capacitor in the negative capacitor array 220 is connected to the VREFP2 at this moment, the bottom plate of the least significant bit first capacitor in the negative capacitor array 220 is adjusted to be connected to the VREFN3.

Reference is made to the foregoing description of the switch control principle, and details are not described herein for the sake of brevity.

Therefore, based on the SAR ADC of the embodiment of the present disclosure, the precision of the ADC is improved from 3 bits to 4 bits for the capacitor arrays of the same size. The required capacitor array is smaller than the conventional 4-bit capacitive SAR ADC, and accordingly, power consumption due to charging and discharging the capacitors in the capacitor array is reduced.

Figure 6:
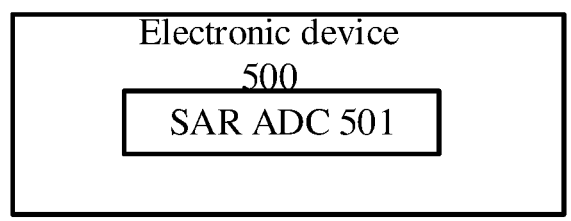
FIG. 6 is a schematic block diagram of an electronic device according to an embodiment of the present disclosure.

In an embodiment of the present disclosure, an electronic device is further provided. As shown in FIG. 6, the electronic device 500 may include an SAR ADC 501. The SAR ADC 501 may be the SAR ADC 200 in the foregoing embodiment. For specific implementation, reference is made to the related description of the foregoing embodiment. For brevity, details are not described herein.

In some embodiments, the electronic device 500 may be, for example, a portable or mobile electronic device such as a mobile phone, a notebook computer, a tablet computer, a game device, or the like, but the embodiments of the present disclosure are not limited thereto.

The foregoing description is merely illustrative of the specific embodiment modes of the present disclosure, but the scope of protection of the present disclosure is not limited thereto. Variations or substitutions may readily occur to those skilled in the art within the technical scope disclosed in the present application, and are intended to be included within the scope of protection of the present disclosure. Accordingly, the scope of protection of the present disclosure shall be subject to the appended claims.

What is claimed is:

1. A successive approximation register analog-to-digital converter (SAR ADC), configured to output a n-bit digital signal ($D_{n-1}, D_{n-2}, \ldots, D_1, D_0$), n being a positive integer greater than 1, the SAR ADC comprising:

a positive capacitor array comprising (n-m) first capacitors ($D_{n-2}C_1, \ldots, D_mC_1, D_0C_1$) arranged in parallel, wherein n>m, and m is a positive integer;

a negative capacitor array comprising (n-m) second capacitors ($D_{n-2}C_2, \ldots, D_mC_2, D_0C_2$) arranged in parallel;

a switch circuit comprising a plurality of groups of first bottom plate switches and a plurality of groups of second bottom plate switches, wherein each group of first bottom plate switches correspond to one first capacitor, each group of second bottom plate switches correspond to one second capacitor, each group of first bottom plate switches are configured to control a bottom plate of a corresponding first capacitor to be connected to a common-mode voltage ($V_{CM}$), a positive differential input signal ($V_{sigp}$), or one of a plurality of reference voltages, each group of second bottom plate switches are configured to control a bottom plate of a corresponding second capacitor to be connected to a common-mode voltage ($V_{CM}$), a negative differential input signal ($V_{sign}$), or one of a plurality of reference voltages, and the plurality of reference voltages have offsets with different precisions with respect to the common-mode voltage ($V_{CM}$);

a comparator, wherein a positive input terminal of the comparator is connected to a top plate of each first capacitor, a negative input terminal of the comparator is connected to a bottom plate of each second capacitor, and the comparator is configured to sequentially output each bit of digital signal in the n-bit digital signal according to voltages at the positive input terminal and the negative input terminal;

an SAR logic circuit, configured to control the reference voltages to which the plurality of first capacitors are connected through the plurality of groups of first bottom plate switches, and control the reference voltages to which the plurality of second capacitors are connected through the plurality of groups of second bottom plate switches according to each bit of digital signal outputted by the comparator;

wherein the SAR logic circuit is configured to:

according to the most significant bit digital signal ($D_{n-2}$) in the n-bit digital signal, connect a bottom plate of each of the first capacitors ($D_{n-2}C_1, \ldots, D_mC_1, D_0C_1$) to a first initial reference voltage in the plurality of reference voltages, and connect a bottom plate of each of the second capacitors ($D_{n-2}C_2, \ldots, D_mC_2, D_0C_2$) to a second initial reference voltage in the plurality of reference voltages, wherein the first initial reference voltage and the second initial reference voltage have opposite offset directions with respect to the common-mode voltage, and the offset amounts of the first initial reference voltage and the second initial reference voltage with respect to the common-mode voltage are not the maximum offset in offset amounts of the plurality of reference voltages with respect to the common-mode voltage, and are also not the minimum offset;

control a target reference voltage connected to a bottom plate of the k-th bit first capacitor ($D_kC_1$) according to the k-th bit digital signal ($D_k$) and the most significant bit digital signal ($D_{n-1}$) in the n-bit digital signal, and control a target reference voltage connected to a bottom plate of the k-th bit second capacitor ($D_kC_2$) according to the k-th bit digital signal ($D_k$) and the most significant bit digital signal ($D_{n-1}$), wherein k=n-2, ..., m;

control a target reference voltage to which a bottom plate of the least significant bit first capacitor ($D_0C_1$) is connected according to the most significant bit digital signal ($D_{n-1}$) and each bit of digital signal of a low m-bit digital signal ($D_{m-1}, \ldots, D_0$) in the n-bit digital signal, and control a target reference voltage to which a bottom plate of the least significant bit second capacitor ($D_0C_2$) is connected according to the most significant bit digital signal ($D_{n-1}$) and each bit of digital signal of the low m-bit digital signal ($D_{m-1}, \ldots, D_0$) in the n-bit digital signal.

2. The SAR ADC according to claim 1, wherein the plurality of reference voltages comprises a first forward reference voltage ($V_{REFP}$), a first reverse reference voltage ($V_{REFN}$), a second forward reference voltage ($V_{REFP2}$), and a second reverse reference voltage ($V_{REFN2}$), wherein the first forward reference voltage ($V_{REFP}$) and the first reverse reference voltage ($V_{REFN}$) each have a first offset with respect to the common-mode voltage ($V_{CM}$), the two first offsets are in opposite offset directions, the second forward reference voltage ($V_{REFP2}$) and the second reverse reference voltage ($V_{REFN2}$) each have a second offset with respect to the common-mode voltage ($V_{CM}$), and the two second offsets are in opposite offset directions, the first offset being greater than the second offset;

wherein the SAR logic circuit is configured to:

control the bottom plate of the k-th bit first capacitor ($D_kC_1$) to be connected to the first forward reference voltage ($V_{REFP}$), the first reverse reference voltage ($V_{REFN}$), the second forward reference voltage ($V_{REFP2}$) or the second reverse reference voltage ($V_{REFN2}$) according to the k-th bit digital signal ($D_k$) and the most significant bit digital signal ($D_{n-1}$); and control the bottom plate of the k-th bit second capacitor ($D_kC_2$) to be connected to the first reverse reference voltage ($V_{REFN}$), the first forward reference voltage ($V_{REFP}$), the second reverse reference voltage ($V_{REFN2}$) or the second forward reference voltage ($V_{REFP2}$) according to the k-th bit digital signal ($D_k$) and the most significant bit digital signal ($D_{n-1}$).

3. The SAR ADC according to claim 2, wherein the first initial reference voltage is the second forward reference voltage ($V_{REFP2}$), and the second initial reference voltage is the second reverse reference voltage ($V_{REFN2}$); or, the first initial reference voltage is the second reverse reference voltage ($V_{REFN2}$), and the second initial reference voltage is the second forward reference voltage ($V_{REFP2}$).

4. The SAR ADC according to claim 3, wherein the SAR logic circuit is configured to:
  when the most significant bit digital signal ($D_{n-1}$) is 1, control the bottom plate of each first capacitor to be connected to the second reverse reference voltage ($V_{REFN2}$), and control the bottom plate of each second capacitor to be connected to the second forward reference voltage ($V_{REFP2}$); or
  when the most significant bit digital signal ($D_{n-1}$) is 0, control the bottom plate of each first capacitor to be connected to the second forward reference voltage ($V_{REFP2}$), and control the bottom plate of each second capacitor to be connected to the second reverse reference voltage ($V_{REFN2}$).

5. The SAR ADC according to claim 3, wherein the SAR logic circuit is configured to:
  when the most significant bit digital signal ($D_{n-1}$) is 1 and the k-th bit digital signal ($D_k$) is 1, control the bottom plate of the k-th bit first capacitor ($D_kC_1$) to be connected to the first reverse reference voltage ($V_{REFN}$), and control the bottom plate of the k-th bit second capacitor ($D_kC_2$) to be connected to the first forward reference voltage ($V_{REFP}$); or
  when the most significant bit digital signal ($D_{n-1}$) is 0 and the k-th bit digital signal ($D_k$) is 1, control the bottom plate of the k-th bit first capacitor ($D_kC_1$) to be connected to the second reverse reference voltage ($V_{REFN2}$), and control the bottom plate of the k-th bit second capacitor ($D_kC_2$) to be connected to the second forward reference voltage ($V_{REFP2}$); or
  when the most significant bit digital signal ($D_{n-1}$) is 1 and the k-th bit digital signal ($D_k$) is 0, control the bottom plate of the k-th bit first capacitor ($D_kC_1$) to be connected to the second forward reference voltage ($V_{REFP2}$), and control the bottom plate of the k-th bit second capacitor ($D_kC_2$) to be connected to the second reverse reference voltage ($V_{REFN2}$); or
  when the most significant bit digital signal ($_{Dn-1}$) is 0 and the k-th bit digital signal ($D_k$) is 0, control the bottom plate of the k-th bit first capacitor ($D_kC_1$) to be connected to the first forward reference voltage ($V_{REFP}$), and control the bottom plate of the k-th bit second capacitor ($D_kC_2$) to be connected to the first reverse reference voltage ($V_{REFN}$).

6. The SAR ADC according to claim 2, wherein the plurality of reference voltages further comprises m reference voltage groups, wherein
  when m=1, one reference voltage group comprises a third forward reference voltage ($V_{REFP3}$), a third reverse reference voltage ($V_{REFN3}$), a fourth forward reference voltage ($V_{REFP4}$), and a fourth reverse reference voltage ($V_{REFN4}$), the third forward reference voltage ($V_{REFP3}$) and the third reverse reference voltage ($V_{REFN3}$) each have a third offset with respect to the second forward reference voltage ($V_{REFP2}$), and the two third offsets are in opposite offset directions, and the fourth forward reference voltage ($V_{REFP4}$) and the fourth reverse reference voltage ($V_{REFN4}$) each have a third offset with respect to the second reverse reference voltage ($V_{REFN2}$), and the two third offsets are in opposite offset directions, wherein the third offset is less than the second offset; or
  when the m is greater than 1, a first reference voltage group of the m reference voltage groups comprises the third forward reference voltage ($V_{REFP3}$), the third reverse reference voltage ($V_{REFN3}$), the fourth forward reference voltage ($V_{REFP4}$), and the fourth reverse reference voltage ($V_{REFN4}$), each reference voltage in the i-th reference voltage group of the m reference voltage groups corresponds to one reference voltage pair in the (i+1)-th reference voltage group, each reference voltage in each reference voltage pair of the (i+1)-th reference voltage group has the (i+2)-th offset with respect to a reference voltage corresponding to the reference voltage pair in the i-th reference voltage group, and the two (i+2)-th offsets are in opposite offset directions, wherein i=1, 2, . . . , and the (i+2)-th offset is less than the (i+1)-th offset;
  wherein the SAR logic circuit is configured to, when the comparator outputs the j-th bit digital signal ($D_j$) of the low m-bit digital signal ($D_{m-1}$, . . . , $D_0$), control the bottom plate of the least significant bit first capacitor ($D_0C_1$) to be connected to the reference voltage in the i-th reference voltage group of the m reference voltage groups according to the most significant bit digital signal ($D_{n-1}$) and a digital signal before the j-th bit digital signal ($D_j$) in the low m-bit digital signals ($D_{m-1}$, . . . , $D_0$), and control the least significant bit second capacitor ($D_0C_2$) to be connected to the reference voltage in the i-th reference voltage group of the m reference voltage groups according to the most significant bit digital signal ($D_{n-1}$) and the digital signal before the j-th bit digital signal ($D_j$) in the low m-bit digital signal ($D_{m-1}$, . . . , $D_0$), wherein j =m−1, m−2, . . . , 0, and i+j=m.

7. The SAR ADC according to claim 6, wherein the second offset is one-half of the first offset, and the third offset is one-half of the second offset.

8. The SAR ADC according to claim 6, wherein
  when the comparator currently outputs the (m−1)-th bit digital signal ($D_{m-1}$), the SAR logic circuit is configured to:
  determine the reference voltage to which the bottom plate of the least significant bit first capacitor ($D_0C_1$) is currently connected according to the most significant bit digital signal ($D_{n-1}$);
  adjust the reference voltage to which the least significant bit first capacitor ($D_0C_1$) is connected according to the (m−1)-th bit digital signal ($D_{m-1}$) and the reference voltage to which the least significant bit first capacitor ($D_0C_1$) is currently connected;
  determine the reference voltage to which the bottom plate of the least significant bit second capacitor ($D_0C_2$) is currently connected according to the most significant bit digital signal ($_{Dn-1}$); and
  adjust the reference voltage to which the least significant bit second capacitor ($D_0C_2$) is connected according to the (m−1)-th bit digital signal ($D_{m-1}$) and the reference voltage to which the least significant bit second capacitor ($D_0C_2$) is currently connected; or
  when the comparator currently outputs the j-th bit digital signal ($D_j$), the SAR logic circuit is configured to:
  determine the reference voltage to which the bottom plate of the least significant bit first capacitor ($D_0C_1$) is currently connected according to the most significant bit digital signal ($D_{n-1}$) and a digital signal before the j-th bit digital signal ($D_j$) in the low m-bit digital signals ($D_{m-1}$, . . . , $D_0$);
  adjust the reference voltage to which the least significant bit first capacitor ($D_0C_1$) is connected according to the j-th bit digital signal ($D_j$) and the reference voltage to which the least significant bit first capacitor ($D_0C_1$) is currently connected;

determine the reference voltage to which the bottom plate of the least significant bit second capacitor ($D_0C_2$) is currently connected according to the most significant bit digital signal ($D_{n-1}$) and the digital signal before the j-th bit digital signal ($D_j$) in the low m-bit digital signal ($D_{m-1}, \ldots, D_0$); and adjust the reference voltage to which the least significant bit second capacitor ($D_0C_2$) is connected according to the j-th bit digital signal ($D_j$) and the reference voltage to which the least significant bit second capacitor ($D_0C_2$) is currently connected, wherein j=m−1, ..., 0.

9. The SAR ADC according to claim 8, wherein the SAR logic circuit is configured to:

when the (m−1)-th bit digital signal ($D_{m-1}$) is 1 and the most significant bit digital signal ($D_{n-1}$) is 0, adjust the bottom plate of the least significant bit first capacitor ($D_kC_1$) to allow the bottom plate of the least significant bit first capacitor ($D_kC_1$) to be connected to the third reverse reference voltage ($V_{REFN3}$), and adjust the bottom plate of the least significant bit second capacitor ($D_0C_2$) to allow the bottom plate of the least significant bit second capacitor ($D_0C_2$) to be connected to the fourth forward reference voltage ($V_{REFP4}$); or when the (m−1)-th bit digital signal ($D_{m-1}$) is 0 and the most significant bit digital signal ($D_{n-1}$) is 0, adjust the bottom plate of the least significant bit first capacitor ($D_0C_1$) to be connected to the third forward reference voltage ($V_{REFP3}$), and adjust the bottom plate of the least significant bit second capacitor ($D_0C_2$) to be connected to the fourth reverse reference voltage ($V_{REFN4}$); or when the (m−1)-th bit digital signal ($D_{m-1}$) is 1 and the most significant bit digital signal ($D_{n-1}$) is 1, adjust the bottom plate of the least significant bit first capacitor ($D_0C_1$) to be connected to the fourth reverse reference voltage (VREFN4), and adjust the bottom plate of the least significant bit second capacitor ($D_0C_2$) to be connected to the third forward reference voltage ($V_{REFP3}$); or when the (m−1)-th bit digital signal ($D_{m-1}$) is 0 and the most significant bit digital signal ($D_{n-1}$) is 1, adjust the bottom plate of the least significant bit first capacitor ($D_0C_1$) to be connected to the fourth forward reference voltage ($V_{REFP4}$), and adjust the bottom plate of the least significant bit second capacitor ($D_0C_2$) to be connected to the third reverse reference voltage ($V_{REFN3}$).

10. The SAR ADC according to claim 8, wherein the SAR logic circuit is configured to:

when the bottom plate of the least significant bit first capacitor ($D_0C_1$) is determined to be connected to a first reference voltage in a first reference voltage group of the m reference voltage groups according to the most significant bit digital signal ($D_{n-1}$) and the digital signal before the j-th bit digital signal ($D_j$) in the low m-bit digital signal ($D_{m-1}, \ldots, D_0$), and the j-th bit digital signal is 0, connect the bottom plate of the least significant bit first capacitor ($D_0C_1$) to a second reference voltage in a next reference voltage group;

when the bottom plate of the least significant bit first capacitor ($D_0C_1$) is determined to be connected to a first reference voltage in a first reference voltage group of the m reference voltage groups according to the most significant bit digital signal ($D_{n-1}$) and the digital signal before the j-th bit digital signal ($D_j$) in the low m-bit digital signal ($D_{m-1}, \ldots, D_0$), and the j-th bit digital signal is 1, connect the bottom plate of the least significant bit first capacitor ($D_0C_1$) to a third reference voltage in a next reference voltage group;

when the bottom plate of the least significant bit second capacitor ($D_0C_2$) is determined to be connected to a fourth reference voltage in a first reference voltage group of the m reference voltage groups according to the most significant bit digital signal ($D_{n-1}$) and the digital signal before the j-th bit digital signal ($D_j$) in the low m-bit digital signal ($D_{m-1}, \ldots, D_0$), and the j-th bit digital signal is 0, connect the bottom plate of the least significant bit second capacitor ($D_0C_2$) to a fifth reference voltage in a next reference voltage group; or when the bottom plate of the least significant bit second capacitor ($D_0C_2$) is determined to be connected to a first reference voltage in a first reference voltage group of the m reference voltage groups according to the most significant bit digital signal ($D_{n-1}$) and the digital signal before the j-th bit digital signal ($D_j$) in the low m-bit digital signal ($D_{m-1}, \ldots, D_0$), and the j-th bit digital signal is 1, connect the bottom plate of the least significant bit second capacitor ($D_0C_2$) to a sixth reference voltage in a next reference voltage group;

wherein the first reference voltage in the first reference voltage group corresponds to the second reference voltage and the third reference voltage in the next reference voltage group, the second reference voltage and the third reference voltage respectively have a positive offset and a negative offset with respect to the first reference voltage; and wherein the fourth reference voltage in the first reference voltage group corresponds to the fifth reference voltage and the sixth reference voltage in the next reference voltage group, the fifth reference voltage and the sixth reference voltage respectively have a positive offset and a negative offset with respect to the fourth reference voltage.

11. The SAR ADC according to wherein the switch circuit further comprises a first positive terminal sampling switch and a second positive terminal sampling switch, wherein a top plate of each first capacitor in the positive capacitor array is connected to the common-mode voltage ($V_{CM}$) through the first positive terminal sampling switch, and a top plate of each second capacitor in the negative capacitor array is connected to the common-mode voltage ($V_{CM}$) through the second positive terminal sampling switch.

12. The SAR ADC according to claim 11, wherein in a sampling phase, the first positive terminal sampling switch is connected to the common-mode voltage ($V_{CM}$), the bottom plate of each first capacitor is connected to a positive differential input signal (Vsigp), the second positive terminal sampling switch is connected to the common-mode voltage ($V_{CM}$), and the bottom plate of each second capacitor is connected to the negative differential input signal (Vsign);

in a conversion phase, the first positive terminal sampling switch is disconnected from the common-mode voltage ($V_{CM}$), the bottom plate of each first capacitor is connected to the common-mode voltage ($V_{CM}$), the second positive terminal sampling switch is disconnected from the common-mode voltage ($V_{CM}$), and the bottom plate of each second capacitor is connected to the common-mode voltage ($V_{CM}$); and the comparator is configured to output the most significant bit digital signal ($D_{n-1}$) according to the voltage at the positive input terminal and the voltage at the negative input terminal.

13. The SAR ADC according to claim 1, wherein in the positive capacitor array, a capacitance value of the least significant bit first capacitor ($D_0C_1$) is equal to a capacitance value of the second-least significant bit first capacitor ($D_mC_1$), and a capacitance value ratio from the second-least significant bit first capacitor ($D_mC_1$) to the most significant bit first capacitor ($D_{n-2}C_1$) satisfies a binary weight;

in the negative capacitor array, a capacitance value of the least significant bit second capacitor ($D_0C_2$) is equal to a capacitance value of the second-least significant bit second capacitor ($D_mC_2$), and the capacitance value ratio from the second-least significant bit second capacitor ($D_mC_2$) to the most significant bit second capacitor ($D_{n-2}C_2$) satisfies the binary weight.

14. An electronic device, comprising the SAR ADC of claim 1.

* * * * *